United States Patent [19]

Salama et al.

[11] Patent Number: 4,956,336
[45] Date of Patent: Sep. 11, 1990

[54] ORIENTED GRAINED Y-BA-CU-O SUPERCONDUCTORS HAVING HIGH CRITICAL CURRENTS AND METHOD FOR PRODUCING SAME

[75] Inventors: Kamel Salama; Venkatakrishnan Selvamanickam, both of Houston, Tex.

[73] Assignee: University of Houston - University Park, Houston, Tex.

[21] Appl. No.: 309,382

[22] Filed: Feb. 10, 1989

[51] Int. Cl.$^5$ ............... C01B 13/14; C01F 11/02; C01G 3/02; C04B 35/60
[52] U.S. Cl. ......................... 505/1; 264/66; 419/25; 419/29; 419/53; 423/604; 423/635; 501/123; 502/346; 505/742
[58] Field of Search ............... 501/123; 502/346; 423/604, 635; 505/1; 264/66; 419/25, 29, 53

[56] References Cited

U.S. PATENT DOCUMENTS 4,824,826 4/1989 Damento et al. ............... 505/1

OTHER PUBLICATIONS

Tajima et. al., "Composition Dependence . . . Y–Ba–Cu–O System", *Jap. Jnl. Appl. Phys.*, vol. 26, No. 5, May 1987, pp. L845–L847.
Marshall et. al., "Ordered-Defect Structure in Epitaxial $YBa_2Cu_3O_{7-x}$ Thin Films", *Phys. Rev. B*, vol. 37 (16), Jun. 1, 1988, pp. 9353–9358.
Kumakura et. al., "Large Magnetization in $YBa_2Cu_3O_7$ . . . ", *Jap. Jnl. Appl. Phys. Lett.*, vol. 27 (2), Feb. 1988, pp. L188–L190.
Narayan et. al., "Microstructure and Properties of $YBa_2C_3O_{9-x}$ . . . ", *Appl. Phys. Lett.*, 51(12), Sep. 21, 1987, pp. 940–942.

*Primary Examiner*—Paul Lieberman
*Attorney, Agent, or Firm*—Pravel, Gambrell, Hewitt, Kimball & Krieger

[57] ABSTRACT

A superconductor material having a current density, J, of from about 30,000 to about 85,000 amps/cm$^2$ at zero magnetic field and 77° K. is disclosed. The 123 superconductor is of the formula $L_1Ba_2Cu_3O_6+\delta$ wherein L is preferably yttrium. The process comprises compacting the solid state reaction product of $L_1Ba_2Cu_3O$ and then sintering the reaction product at a temperature between about 40° C. to about 90° C. below its melting point, i.e., for $Y_1Ba_2Cu_3O_6+\delta$ at a temperature of approximately 940° C. The composition is then heated in a preheated chamber maintained at approximately 1090° C. to about 1,200° C. (approximately 1,100° C. for $Y_1Ba_2Cu_3O_6+\delta$) until it has been decomposed, and is then rapidly cooled to a temperature between about 10° C. to about 30° C. above its melting point, i.e. for $Y_1Ba_2Cu_3O_6+\delta$ a temperature of 1030° C. and then is control cooled at a rate of 1° C./hr until it reaches a temperature of about 20° C. to about 40° C. below its melting point, i.e., for $Y_1Ba_2Cu_3O_6+\delta$ a temperature of 980° C. The composition is steadily held at this temperature for at least eight hours, and then cooled to a temperature of approximately 400° C. below its melting point (for $Y_1Ba_2Cu_3O_6+\delta$ approximately a temperature of 600° C.). The material is then slowly cooled by another 200° C. and is then annealed in oxygen.

7 Claims, 3 Drawing Sheets

ORIENTED GRAINED Y-BA-CU-O SUPERCONDUCTORS HAVING HIGH CRITICAL CURRENTS AND METHOD FOR PRODUCING SAME

BACKGROUND OF THE INVENTION

Since its discovery in 1911, many applications for the phenomena of superconductivity have been conceived which could not be commercialized because of the extreme low temperatures required by the superconductive material. Although many materials have been examined since 1911 in an effort to find compounds which will superconduct at higher, more practical temperatures, the highest temperature superconductor known until about 1986 was $Nb_3Ge$ having a critical temperature, To, of approximately 23.3° K. Superconducting devices utilizing $Nb_3Ge$ as the superconductor thus required the use of liquid helium as refrigerant-coolant in commercial applications.

In 1986 Bednorz and Muller disclosed that certain mixed phase compositions of La-Ba-Cu-O appeared to exhibit superconductivity at about 30° K. Investigation of that system established that the crystalline phase therein responsible for superconductivity had a crystal structure like that of $K_2NiF_4$ (214). The upper temperature limit of onset, $T_{co}$, for superconductors of a 214 type crystalline structure has been found to be about 48° K.

Following the discovery of superconductivity in such rare earth-alkaline earth Cu oxide systems of a 214 crystalline structure, a new class of rare earth-alkaline earth-copper oxides was discovered which were superconductive at temperatures above 77° K.

This new class of rare earth-alkaline earth-copper oxides are now commonly referred to as "123" high-temperature superconductors. The "123" high temperature superconductors have perovskite related crystalline structures and a unit cell formula of $L_1M_2Cu_3O_6+\delta(\delta=0.1$ to 1.0, preferably about 1.0) wherein L is Scandium, yttrium, lanthanum, cerium, praseodymium, neodymium, samarium, europium, gadolinium, terbium, dysprosium, holmium, erbium, thulium, ytterbium, and lutetium, and M is barium, strontium or mixtures thereof. The preferred 123 is $Y_1Ba_2Cu_3O_6+\delta$. With the discovery of the 123 class of high temperature superconductivity compositions it has become possible to economically pursue many previously conceived applications of the superconductivity phenomena which were commercially impractical wherein cooling by liquid helium was required. Since they superconduct at temperatures greater than 77° K., the new "123" class of high temperature superconductors may in practical applications be cooled with liquid nitrogen—a more economically feasible refrigerant. As a result, the rather complex thermal insulation and helium-recycling systems employed with conventional superconductors to avoid wasting the expensive helium coolant has been abandoned, thereby greatly simplifying and enhancing the reliability of commercial superconductors.

However, the prior applications of the heretofore high temperature superconductors have not been sufficient due to their inability to carry high current loads in intense magnetic fields, which thereby constitutes a significant commercial barrier against use of the 123 superconductors in numerous applications, such as in magnetic separators, transmission lines and magnetically levitating trains (meglav). In magnetic separators, for example, superconductors are required to have a current density, J, between about 33,000 and 66,000 amps/cm² in a magnetic field between 2 and 3 T. Further, to be commercially viable, underground superconducting transmission lines cooled with liquid nitrogen must have the capacity to carry large amounts of current, approximately 10,000 to 40,000 amps/cm² at a magnetic field of approximately 0.2 T.

SUMMARY OF THE INVENTION

The invention comprises a 123 high temperature superconductor material having a current density, J, of from about 30,000 to about 85,000 amps/cm² at zero magnetic field and 77° K. The preferred 123 superconductor for fabrication by the process of the invention is $L_1Ba_2Cu_3O_6+\delta$ wherein L is yttrium. The process comprises compacting the solid state reaction product of $L_1Ba_2Cu_3O$ and then sintering the reaction product at a temperature between about 40° C. to about 90° C. below its melting point, i.e., for $Y_1Ba_2Cu_3O_6+\delta$ at a temperature of approximately 940° C. The composition is then heated in a preheated chamber maintained at approximately about 80° C. to about 190° C. above the melting point of the 1, 2, 3 superconductor, generally about 1,090° C. to about 1,200° C. (approximately 1,100° C. for $Y_1Ba_2Cu_3O_6+\delta$) until it has been decomposed and partially melted and is then rapidly cooled to a temperature about 10° C. to about 30° C. above its melting point, i.e. for $Y_1Ba_2Cu_3O_6+\delta$ a temperature of about 1030° C. and then is cooled at a controlled rate of 1° C./hr until it reaches a temperature of approximately 20° to 40° C. below its melting point, i.e., for $Y_1Ba_2Cu_3O_6+\delta$ a temperature of about 980° C. During this process, the grains comprising the material are formed and grown in length approximately 10,000 to 15,000 μm. The material is steadily held at 980° C. for at least eight hours in order to complete the resolidification process. The material is then cooled to a temperature of approximately 400° C. below its melting point (for $Y_1Ba_2Cu_3O_6+\delta$ approximately a temperature of about 600° C.). The material is then slowly cooled by about another 200° C. and is then annealed in oxygen.

DETAILED DESCRIPTION OF THE PREFERRED EMBODIMENT

Figure 1:
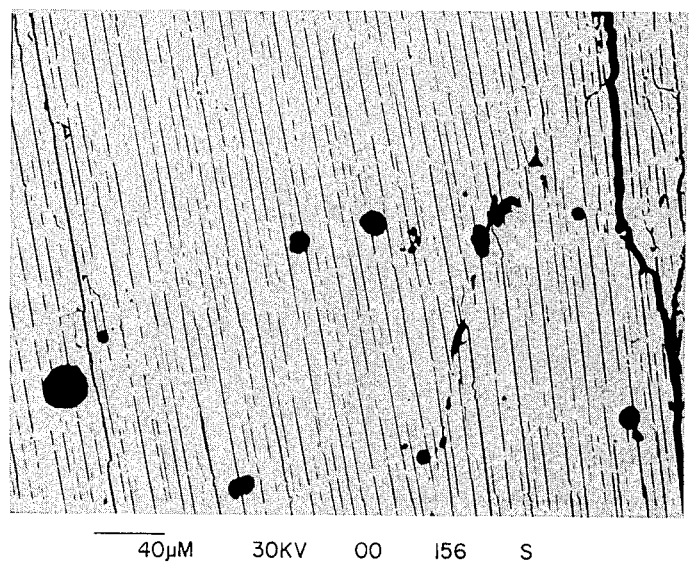
FIG. 1 is 300 times magnification of a scanning electron microscope picture of the top surface of a $Y_1Ba_2Cu_3O_6+\delta$ composition of this invention as prepared according to the Example.

Superconducting compositions of this invention comprise an oxide complex defined by the formula:

$$L_1Ba_2Cu_3O_6+\delta$$

wherein L is a rare earth element and δ has a number value of from about 0.1 to about 1.0. Most preferably L is yttrium. Such compositions are characterized by attainment of a zero resistance state at a transition temperature, $T_{c1}$, of 77° K. or higher. When prepared in accordance with the process of this invention, such oxide complexes exhibit a J, (defined as the amount of current carried by a 1 cm² cross-section of material) in zero magnetic field at 77° K., of from about 30,000 to about 85,000 amps/cm². Generally, the J of the oxide complexes of this invention are greater than 70,000 amps/cm². At 77° K. and an applied magnetic field of 0.6 T, the composition of this invention exhibits a J in excess of 37,000 amps/cm². Further, at 77° K. and zero magnetic field, the composition of this invention exhibits a D.C. current density in excess of 18,500 amps/cm².

The oxide complexes of this invention are comprised of plate shaped grains having a length between approximately 10,000 μm to about 15,000 μm. Such plate shaped grains are primarily stacked parallel to each other in the a-b basal plane of the superconductor. The average attainment of a zero resistance state at a transition temperature, $T_c$, of 77° K. or higher width of the grains is between 16 to about 24 μm, preferably 20 μm. The average width of the complex of this invention is between about 4,500 to about 5,500 μm. The shape, length and orientation of the grains are primarily responsible for the dense structure of the oxide and its enhanced conductivity.

The present invention also provides a process for producing the superconductive oxide complexes. In this process, selected amounts of solid powdered compounds containing barium, copper, oxygen and preferably yttrium, are thoroughly mixed and heated in order to complete a solid state reaction. When the complex is of the $Y_1Ba_2Cu_3O_{6+\delta}$, for example, the complex may be derived from 15 Wt. % $Y_2O_3$, 53 wt. % $BaCO_3$, and 32 wt. % CuO. The solid powder compounds are preferably mixed in an intensive mixer, such as a jar mill or, more preferably, a ball mill. The mixture is then heated in air at a temperature of between about 920° C. to about 960° C. for a time sufficient to react the mixture in the solid state. When "L" in the above 123 formula is yttrium, the composition is preferably heated to approximately 920° to 940° C. Normally, the mixture is kept at this target temperature for approximately 24 hours. The sample is then rapidly quenched to approximately room temperature in air or an inert gas atmosphere. The sample is then compressed by applying a pressure to the sample which is between about 9,000 to about 11,000 psi until the particles are held together to form a bulk material. When L is yttrium, the pressure is approximately 10,000 psi. The compaction process preferably renders bars having dimensions approximating 6 to 24 mm×4 to 16 mm×30 to 65 mm. Such bars ensure a more uniform distribution of heat within the complex and further assists in the attainment of the desired length of the grains.

The compacted powder is then sintered at a pressure between about 0 to about 2 kilobars and at a temperature of approximately 50° C. to about 90° C. below its melting point. When L is yttrium, for example, the mass is heated to from about 920° C. to about 960° C. for approximately 24 hours.

Preferably, prior to heating, the preferred bars are partially sliced to a thickness of approximately 1.25 mm. to about 2.5 mm. Such slicing is preferably achieved with a diamond saw.

The sintered product is then decomposed by heating it for the appropriate time, generally about 6 to about 12 minutes, in a chamber preheated to a temperature approximately 80° C. to about 190° C. above the melting point of the solid product, generally from about 1090° C. to 1200° C. When the oxide is $Y_1Ba_2Cu_3O_{6+\delta}$, the mass is heated at a temperature of approximately 1100° C. for approximately 8 to 12 minutes, most preferably ten minutes.

The molten composition is then cooled in two distinct phases. In the first phase, the entire composition is rapidly cooled to a temperature approximately 20° C. to 40° C. above the melting point of material, generally between about 1010° C. to about 1040° C. When L is yttrium, the molten composition is rapidly cooled to 1030° C. in less than about five minutes. In the second phase, the composition is slowly cooled, such that it undergoes peritetic transformation, at a rate of approximately 1° C. per hour until the steady state temperature, approximately 20° C. to about 40° C, below the melting point of the oxide is attained. The steady state temperature is generally between about 960° C. to about 1000° C. When L is yttrium, the composition is cooled generally by 1° C. per hour over 50 hours from about 1030° C. to about 980° C. Such a cooling rate is primarily responsible for the formation and positioning of the superconductor grains nearly parallel to one another. During this cooling the grains grow to a length of approximately 10,000 to approximately 15,000 micrometers. The specimen is maintained at the steady state temperature for a time sufficient to complete the solidification process. For a $Y_1Ba_2Cu_3O_{6+\delta}$ oxide complex, the sample is held at 980° C. for approximately eight hours for the completion of solidification.

The sample is then further cooled at a rate such that the formation of microcracks is minimized. This is generally achieved by cooling the grains in air to approximately 400° C. below its melting point at the rate of approximately 50° C. per hour. In a $Y_1Ba_2Cu_3O_{6+\delta}$ composition, for example, the specimen is cooled from 980° C. to approximately between 550° C. to about 650° C. in approximately 5.5 to about 6.5 hours. Such gradient cooling renders little disruption, if any, to the near-parallel orientation of the grains.

The transformation of the crystal lattice of the complex from a non-superconductive state to a superconductive state wherein the orthorhombicity of the crystal lattice is maximized is achieved by subsequently cooling the complex in air to a temperature approximately 600° C. below its melting point. The rate of cooling is approximately 30° C. per hour. In a $Y_1Ba_2Cu_3O_{6+\delta}$ composition, the complex is transformed to its superconductive state by cooling it to approximately 380° C. to about 420° C. from approximately 550° C. to about 650° C. in approximately six and a half hours.

The requisite amount of oxygen to obtain a formula of $Y_1Ba_2Cu_3O_{6+\delta}$ is then diffused into the orthorhombic grains by annealing it in an oxygen-containing atmosphere for sufficient time. The resulting crystal having a perovskite structure.

Preferably, the annealing step of the process of this invention is comprised of three distinct stages. All of the stages proceed in the presence of oxygen. In the first stage, the sample is heated for approximately 11 to 13 hours at a temperature of approximately 580° C. to approximately 620° C. In the second stage, the sample is annealed at a temperature approximately 100° less than the first stage, i.e., approximately 480° C. to approximately 520° C. for the same period of time. In the last stage, the sample is annealed at a temperature of approximately 380° C. to approximately 420° C. for approximately 11 to 13 hours. Such a three stage annealing step increases the diffusion of oxygen into the complex, thereby enhancing the formation of the orthorhombic state.

The process of this invention permits the manufacture of superconductive materials of significantly greater dimensions and volumetric size than products produced by the processes of the prior art. Further, superconductive oxides of a given volumetric size are produced in a fraction of the time under this process than under the processes of the prior art. For example, under the preferred embodiments of this invention, a superconductive material with a volume in excess of 6500 mm$^3$ can be prepared in approximately 130 hours.

Figure 2:
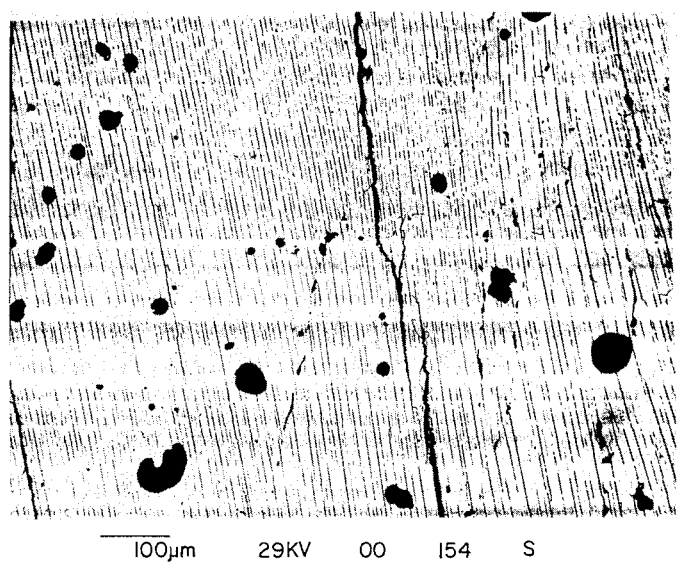
FIG. 2 is a 150 times magnification of a scanning electron microscope picture of a $Y_1Ba_2Cu_3O_6+\delta$ composition prepared in accordance with the Example.
Figure 3:
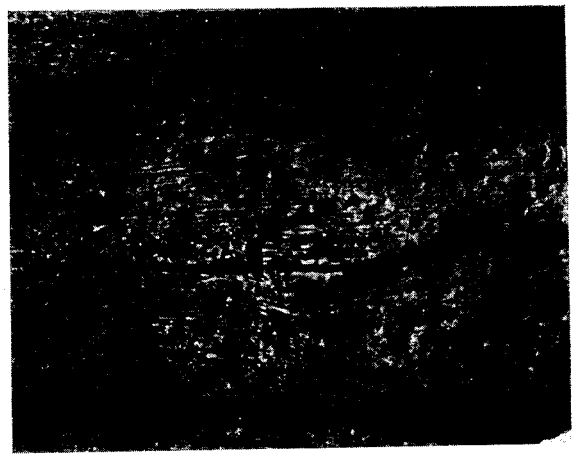
FIG. 3 is an optical photomicrograph of 40 times magnification of a $Y_1Ba_2Cu_3O_6+\delta$ composition of this invention as prepared according to the Example.

Shown in FIGS. 1 and 2 are scanning electron microscopes at 300 and 150 magnifications, respectively, of the composition prepared in accordance with this invention. The oxides prepared in accordance with this invention are comprised of long plate shaped grains typically between 10,000 and approximately 15,000 micrometers in length and approximately 20 micrometers in width. The plate axis coincides with the a-b direction in the superconducting layer of the orthorhombic phase. FIG. 3 illustrates the composition of this invention viewed from an optical photomicrograph at 40 magnification. The parallel plates are characterized by a length of approximately 10,000 to 15,000 micrometers. The length of the grains greatly enhances the conductivity of current. The elongated grains of the oxide of this invention and the crystallographic alignment of the grains along its superconducting direction are highly beneficial for the flow of supercurrent thereby permitting higher J values for the superconductors than those of the prior art. The length of the grains greatly enhances the conductivity of current.

EXAMPLE

In a jar mill were mixed 15 weight percent of $Y_2O_3$, 53 weight percent $BaCO_3$ and 32 weight percent CuO. The mixture was placed in an enclosed platinum container which was then heated at a rate of about 7° C. per minute in air until a temperature of 940° C. was obtained. The mixture was allowed to react at this temperature for about 24 hours. Bar samples of dimensions of 12.7 mm×7.6 mm×63.5 mm were obtained by cold pressing (at room temperature) the oxide mixture into pellets at an applied pressure of 10,000 psi. The bars were then partially sliced into sections of thickness 2.5 mm. The samples were then heated in a preheated oven maintained at 1100° C. for ten minutes.

This sample is then cooled rapidly to 1030° C. and then cooled at a rate of 1° C. per hour to 980° C. The sample was held at 980° C. for eight hours and then cooled to 600° C. at the rate of approximately 60° C. per hour. This sample was then additionally cooled slowly to 400° C. at a rate of approximately 30° C. per hour. The sample was then annealed in oxygen for 12 hours each at 600°, 500° and 400° C.

The current density, J at 77° K. was tested. At a pulse of 1 msec, J was 75,000 amps/cm$^2$ at zero magnetic field and J was greater than 37,000 amps/cm$^2$ at a 0.6 T magnetic field. A J, for D.C. current, was measured in excess of 18,500 amp/cm$^2$ at 77° K. and zero magnetic field.

As is readily apparent from the above description additional advantages and modifications will readily occur to one skilled in the art. The invention in its broader aspects is therefore not limited to the specific examples shown and described. Accordingly, departures may be made from the details shown in the example without departing from the spirit or scope of the disclosed general inventive concept.

We claim:

1. A process for preparing a superconducting metal oxide complex comprising the steps of:
   (a) mixing solid compounds containing Y, Ba, Cu and O in amounts appropriate to yield the formula $Y_1Ba_2Cu_3O_6+\delta$ wherein $\delta$ has a number value of from about 0.1 to about 1.0;
   (b) heating the solid compounds in air to a temperature between about 920° C. to about 960° C. for a time sufficient to react the compounds in the solid state
   (c) quenching the solid state reaction product to ambient temperature in air;
   (d) compacting the mixture into a solid mass by application of pressure from about 9,000 to about 11,000 psi;
   (e) sintering the solid mass in air at a temperature between about 920° C. to about 960° C.;
   (f) heating the solid mass in a preheated chamber to a temperature of from about 1,090° C. to 1,200° C. for a time sufficient to partially melt and decompose said mass;
   (g) rapidly cooling the mass to a temperature between about 1,020° to about 1,040° C. and then cooling said mass to a steady temperature between about 20° C. to 40° C. below its melting point at a rate of approximately 1° C./hour;
   (h) maintaining the mass at said steady temperature for a time sufficient for the entire mass to resolidify;
   (i) cooling said resolidified mass in air from said steady temperature to approximately 550° C. to 650° C. at the rate of approximately 60° C. per hour;
   (j) additionally cooling the resolidified mass to about 380° C. to about 420° C. at the rate of approximately 30° C. per hour in air; and
   (k) annealing the resolidified mass in an oxygen containing atmosphere for a time sufficient for the requisite amount of oxygen to diffuse into the mass.

2. The process of claim 1 wherein the resulting compacted solid mass from step (d) are bars having the dimensions 6-24 mm×4-16 mm×33-130 m.

3. The process of claim 2 wherein prior to heating in step (f) said bars are partially sliced to a thickness between about 1.25 mm to about 2.5 mm.

4. The process of claim 1, wherein the heating of the solid mass in step (e) is conducted at a pressure between about zero to about 2 kilobars.

5. The process of claim 1, wherein said resolidified mass is annealed in oxygen in three distinct and separate temperature zones for 11 to 13 hours per zone.

6. The process of claim 5, wherein the first temperature zone is between about 580° C. to about 620° C., the second temperature zone is between about 480° C. to about 520° C. and the third temperature zone is between about 380° C. to about 420° C.

7. The process of claim 5, wherein said solid compounds of step (a) are $Y_2O_3$, $BaCO_3$ and CuO.

* * * * *